United States Patent
Aggarwal et al.

(10) Patent No.: US 9,407,482 B2
(45) Date of Patent: Aug. 2, 2016

(54) TUNABLE RF N-PATH FILTER

(71) Applicant: Nokia Corporation, Espoo (FI)

(72) Inventors: Sudhir Aggarwal, Fremont, CA (US); Md Naimul Hasan, Davis, CA (US)

(73) Assignee: Nokia Technologies Oy, Espoo (FI)

( * ) Notice: Subject to any disclaimer, the term of this patent is extended or adjusted under 35 U.S.C. 154(b) by 0 days.

(21) Appl. No.: 14/077,072

(22) Filed: Nov. 11, 2013

(65) Prior Publication Data

US 2015/0133068 A1    May 14, 2015

(51) Int. Cl.
| | |
|---|---|
| H04B 1/16 | (2006.01) |
| H04L 27/148 | (2006.01) |
| H03H 19/00 | (2006.01) |
| H04J 3/02 | (2006.01) |

(52) U.S. Cl.
CPC ........... *H04L 27/148* (2013.01); *H03H 19/002* (2013.01); *H04J 3/025* (2013.01)

(58) Field of Classification Search
CPC ......... H03H 7/0161; H03H 7/06; H03H 7/17; H03H 7/42; H03H 11/0422; H03H 11/1291; H03H 7/0115; H04B 1/30; H04B 1/1027; H04B 1/18; H03J 3/08; H03J 3/24; H03J 3/06
USPC ......... 455/131, 296, 303, 307, 313, 323, 333, 455/334, 338–340
See application file for complete search history.

(56) References Cited

U.S. PATENT DOCUMENTS

| | | |
|---|---|---|
| 3,603,898 A | 9/1971 | Dawson et al. |
| 3,737,799 A | 6/1973 | Stander |
| 5,491,453 A | 2/1996 | Ichihara |
| 5,512,963 A * | 4/1996 | Mankovitz ..................... 348/725 |
| 5,525,940 A | 6/1996 | Heikkila et al. |
| 5,613,234 A * | 3/1997 | Vella-Coleiro ............... 455/340 |
| 5,724,000 A | 3/1998 | Quinn |
| 8,149,742 B1 | 4/2012 | Sorsby |

(Continued)

FOREIGN PATENT DOCUMENTS

| | | |
|---|---|---|
| EP | 0610911 A2 | 8/1994 |
| JP | S63213001 A | 9/1988 |

OTHER PUBLICATIONS

Ghaffari, Amir et al. "Tunable High-Q N-Path Band-Pass Filters: Modeling and Verification". IEEE Journal of Solid-State Circuits, IEEE Service Center, Piscataway, NJ, USA. vol. 46, No. 5, May 1, 2011, 13 pages.

(Continued)

*Primary Examiner* — Nhan Le

(74) *Attorney, Agent, or Firm* — Mintz Levin Cohn Ferris Glovsky and Popeo, P.C.

(57) ABSTRACT

Methods and apparatus, including computer program products, are provided for tunable filters. In one aspect there is provided an apparatus. The apparatus may include a bandpass filter comprising a resistive-capacitive configuration of N-path filters tunable to a first center frequency based on at least a first clock frequency; a notch filter comprising a capacitive-resistive configuration of N-path filters tunable to a second center frequency based on at least a second clock frequency; and a combiner coupled to the bandpass filter and the notch filter to combine a bandpass output signal provided by the bandpass filter and a notch output signal provided by the notch filter, wherein the combiner outputs a combined output. Related apparatus, systems, methods, and articles are also described.

15 Claims, 11 Drawing Sheets

(56) References Cited

U.S. PATENT DOCUMENTS

| | | | |
|---|---|---|---|
| 8,687,736 B1* | 4/2014 | Huynh | H04L 5/06 375/322 |
| 9,071,325 B2* | 6/2015 | Pullela | H04B 1/1638 |
| 2004/0095951 A1 | 5/2004 | Park | |
| 2008/0136473 A1 | 6/2008 | Bollenbeck et al. | |
| 2009/0002066 A1 | 1/2009 | Lee et al. | |
| 2011/0075593 A1 | 3/2011 | Chen et al. | |
| 2012/0214435 A1 | 8/2012 | Javor et al. | |
| 2013/0335163 A1* | 12/2013 | Aggarwal et al. | 333/132 |
| 2013/0336342 A1 | 12/2013 | Aggarwal | |

OTHER PUBLICATIONS

Ghaffari, Amir et al. "Tunable High-Q N-Path Band-Pass Filters: Modeling and Verification". IEEE Journal of Solid-State Circuits, IEEE Service Center, Piscataway, NJ, USA. vol. 48, No. 6, Jun. 1, 2013, 13 pages.

Darvishi, Milad et al. "Widely Tunable 4th Order Switched Gm-C Band-Pass Filter Based on N-Path Filters". IEEE Journal of Solid-State Circuits, IEEE Service Center, Piscataway, NJ, USA. vol. 47, No. 12, Dec. 1, 2012, 15 pages.

* cited by examiner

TUNABLE RF N-PATH FILTER

FIELD

The subject matter described herein relates to wireless communications, and, more particularly, to radio frequency filters.

BACKGROUND

Software defined radios may offer the promise of wider capability in a smaller hardware footprint. In cellular handsets, a wider variety of radio capabilities is introduced in a single mobile terminal while still fitting neatly in a pocket. These software-defined radios may operate over a wide range of frequencies to implement multi-mode and multi-band functionality for cellular and data connectivity applications. Multi-band radios may be increasingly required by certain cellular radio access technologies (RAT), such as evolved Universal Terrestrial Radio Access Network (E-UTRAN, also known as Long Term Evolution, or LTE).

SUMMARY

Methods and apparatus, including computer program products, are provided for tunable filters.

In one aspect there is provided an apparatus. The apparatus may include a bandpass filter comprising a resistive-capacitive configuration of N-path filters tunable to a first center frequency based on at least a first clock frequency; a notch filter comprising a capacitive-resistive configuration of N-path filters tunable to a second center frequency based on at least a second clock frequency; and a combiner coupled to the bandpass filter and the notch filter to combine a bandpass output signal provided by the bandpass filter and a notch output signal provided by the notch filter, wherein the combiner outputs a combined output.

In some variations, one or more of the features disclosed herein including the following features can optionally be included in any feasible combination. A splitter may be coupled to the bandpass filter and the notch filter. The splitter may provide a differential signal to an input of the notch filter and the bandpass filter. The splitter may include a balun. The combiner may include a differential difference amplifier. A clock may tune at least one of the first center frequency and the second center frequency by at least varying a frequency of at least one of the first clock and the second clock. The first clock frequency and the second clock frequency may be the same frequency. The resistive-capacitive configuration of N-path filters may include one or more transistors coupled to one or more capacitors. The first center frequency may include a center of a pass band of the bandpass filter. The second center frequency may include a center of a notch band of the notch filter. The combined output may include a notch frequency at a frequency offset from the second clock frequency.

The above-noted aspects and features may be implemented in systems, apparatus, methods, and/or articles depending on the desired configuration. The details of one or more variations of the subject matter described herein are set forth in the accompanying drawings and the description below. Features and advantages of the subject matter described herein will be apparent from the description and drawings, and from the claims.

Figure 1:
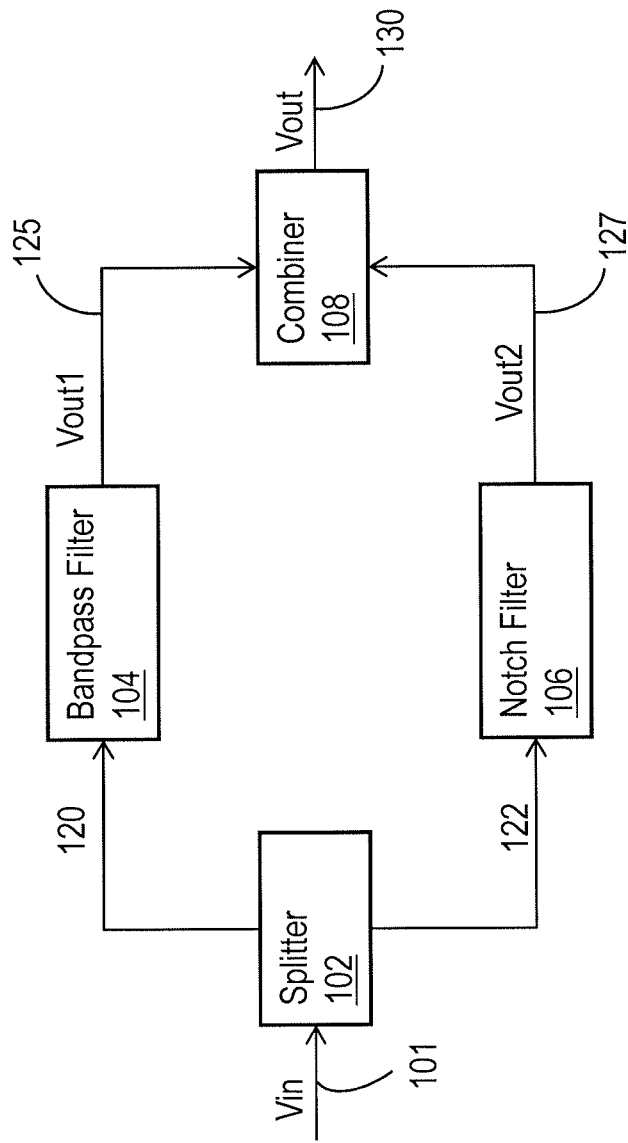
FIG. 1 depicts an example of a radio frequency filter, in accordance with some example embodiments.

Like labels are used to refer to same or similar items in the drawings.

DETAILED DESCRIPTION

In the typical radio frequency (RF) front-end, the first component after the antenna may be a multi-band switch/diplexer followed by a duplexer. In existing handsets, many duplexers may be used, depending upon the number of respective receive/transmit bands and their corresponding bandwidths. The duplexer may provide isolation between a transmitter and a receiver, to thereby enable the same antenna to be used for both transmitting and receiving. The transmit signal may have a very high power, up to for example 33 dBm, while the receiver may receive signals as low as for example −109 dBm. Therefore, the transmitted signal may be isolated from the received signal even though the transmitter and the receiver may be operating in different frequency bands. In addition to leakage from the transmitter to the receiver, there may be other blocking signals in the vicinity of the desired signal that also may be suppressed. Typically, the transmit and receive frequencies are not widely separated, so in practice, about 50 dB of isolation may be formed between the transmitter and the receiver. This degree of isolation may be provided by a surface acoustic wave (SAW) filter that may operate over a limited band of frequencies.

While a SAW filter may be sufficient for operation across a limited frequency band, as occurs for example in UTRAN, the SAW filter may be too cumbersome, costly, large, narrow-band, and/or inefficient for use in more advanced RATs, such as LTE. SAW filters may provide a significant insertion loss on the order of 2 or 3 dB, which may negatively impact the sensitivity and noise figure of a receiver. Likewise, a significant portion of the transmitted output power may be dissipated as heat in the SAW filter. The SAW filter may thus have several drawbacks, which may render the SAW filter ill-suited for use in the RF front-end of a software defined radio. In addition to the aforementioned drawbacks, SAW filters may occupy too much of the available area on a printed circuit board, which may impact the form factor of a host mobile device. Moreover, SAW filters may not adequately suppress undesired signals close in frequency to the desired signal, but this reception condition may be commonplace in multi-band and multi-mode smart-phones.

A single radio transceiver may be desirable both for cellular and data connectivity applications. With the opening of several new frequency bands for cellular applications, a reconfigurable multi-standard radio may be implemented to operate over a wide range of frequencies. Moreover, the multi-standard radio may operate over one or more frequency bands. If a handset is configured to implement more than one standard such as GSM, WCDMA, LTE, or WiFi, the handset may be equipped with separate RF transceivers for implementing each of the standards.

For a user equipment's radio transceiver to support a plurality of radio access technologies (RATs) over a range of frequencies, the radio transceiver may include a tunable RF filter, such as a tracking filter. An example of a tracking filter is an N-path filter, examples of which are shown and described in U.S. patent application Ser. No. 13/495,489, entitled "METHOD AND DEVICE FOR IMPLEMENTING TRACKING FILTERS AND RF FRONT END OF SOFTWARE DEFINED RADIOS," filed Jun. 13, 2012, and U.S. patent application Ser. No. 13/852,512, entitled "METHOD AND APPARATUSES FOR IMPLEMENTING VARIABLE BANDWIDTH TRACKING FILTERS FOR RECONFIGURABLE MULTI-STANDARD RADIOS," filed Mar. 28, 2013, the contents of both applications are incorporated by reference herein. These tunable RF filters may allow a radio transceiver to operate over a wide frequency range associated with various RATs.

In some example embodiments, there is provided a tunable RF filter including a bandpass filter, a notch filter, and a combiner. Furthermore, the bandpass filter and notch filter may each comprise a tracking filter, such as a tracking N-path filter. Moreover, the notch filter may, in some example embodiments, be configured to attenuate interfering signals, such as out-of band (OOB) signal blockers. An example of an interfering signal/blocker is the radio transceiver's own transmit signal, although other interfering signal/blockers may be filtered by the notch filter as well. The RF filter may, in some example embodiments, also filter higher-order harmonics, such as a third harmonic or a fifth harmonic, of the pass band signals or other signals, such as the rejection of the radio transceivers local oscillator. Thus, the RF filter may, in some example embodiments, be used in a radio transceiver to provide a tunable RF filter to operate over one or more frequency bands, while also providing blocker suppression.

FIG. 1 depicts an example of a tunable RF filter 100, in accordance with some example embodiments.

The tunable RF filter 100 may, in some example embodiments, be included in a transceiver of a user equipment, such as a smartphone, and the like, although the tunable RF filter 100 may be used in other devices as well.

In some example embodiments, tunable RF filter 100 may include a signal splitter 102 coupled to a bandpass filter 104 and a notch filter 106. The RF filter 100 may further include a combiner 108 coupled to the outputs of bandpass filter 104 and notch filter 106.

The signal splitter 102 may, in some example embodiments, receive a single-ended RF signal input 101 (labeled Vin), and then split the RF input signal 101 into two signals 120 and 122, which may comprise differential signals. For example, signal splitter 102 may comprise a balun, which converts a single-ended input signal 101 into differential signals 120 and 122.

The RF input signal 101 may correspond to an RF band being received at a radio transceiver front-end, which includes tunable RF filter 100. This received RF band may be at a certain frequency, such as at a clock frequency of the tunable RF filter. Although some of the examples described herein refer to tunable RF filters for use in a receiver, the tunable RF filters disclosed herein may be used in a transmitter as well as other applications.

Differential signals 120 and 122 may serve as an input to bandpass filter 104, the output of which is input to combiner 108. The bandpass filter 104 may allow a portion of the RF spectrum to pass but may reject (for example, filters, reduces, stops, and the like) another portion of the RF spectrum. In some example embodiments, the bandpass filter 104 may comprise tunable N-path filters. Each of the N-paths (or phases) may include a switch (for example, a transistor having an associated resistance, R) and a capacitor. The N-path filters (and the corresponding pass band) may be tuned across a frequency range using a multi-phase clock, an example of which is depicted at 450 at FIG. 4 below. For example, the frequency of the multi-phase clock may be changed to tune and thus change the center frequency of the pass band of the bandpass filter 104. Moreover, changing the capacitor values of bandpass filter 104 may vary the bandwidth of the bandpass filter 104.

Differential signal 120 and 122 may serve as an input to notch filter 106. The notch filter output 127 may serve as an input to combiner 108. The notch filter 106 may be configured to notch out (for example, reject, filter, and the like) a portion of the RF spectrum at a certain frequency. In some example embodiments, the notch filter may be driven by the same clock frequency as the band pass filter, while the effective notch frequency after the combiner 108 may be created at an offset frequency to the clock frequency. The amount of offset may be a function of the resistance and capacitance values of the band pass filter and the notch filter. Furthermore, changing the capacitor values of notch filter 106 may vary the bandwidth of the notch filter 106.

To illustrate, notch filter 106 may be configured to notch an interfering/blocking signal, such as the transceiver's own transmit signal, although other signals may be suppressed as well. A radio's transmitter is typically at a much higher signal level, when compared to the signals received by the radio, so notch filter 106 may be tuned to reject/suppress and thus reduce this interfering/blocking signal at an offset frequency.

Figure 5A:
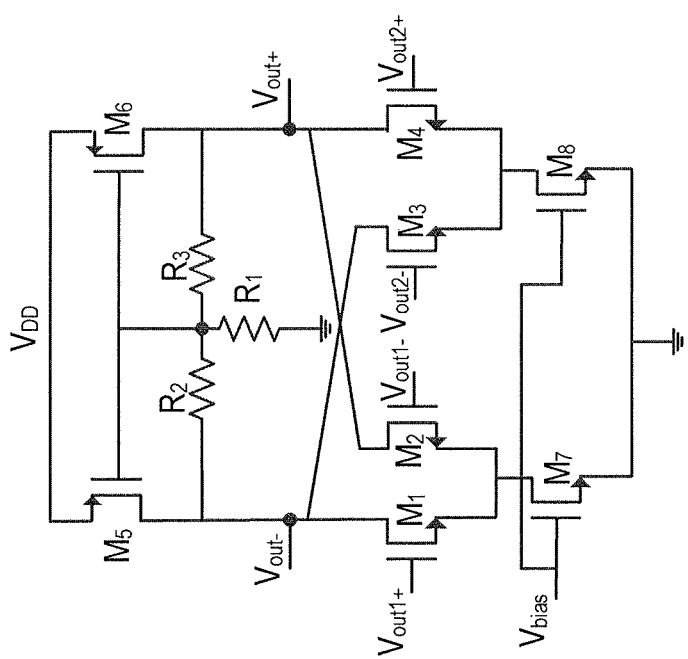
FIG. 5A depicts an example of differential difference amplifier.

The combiner 108 may combine (for example, take the difference of) bandpass filter output signal 125 and notch filter output 127 to provide an output signal 130 (labeled Vout). In some example embodiments, the signals 125 and 127 may be differential signals, and the combiner 108 may comprise a differential difference amplifier (as shown in the example of FIG. 5A below). The combined output signal 130 may, in some example embodiments, have a magnitude frequency response including a pass band centered on for example a clock frequency and a notch at an offset frequency to the clock frequency.

When the combiner 108 is implemented as a differential difference amplifier, the combiner 108 may also provide some gain to the combined signal output 130.

Figure 2:
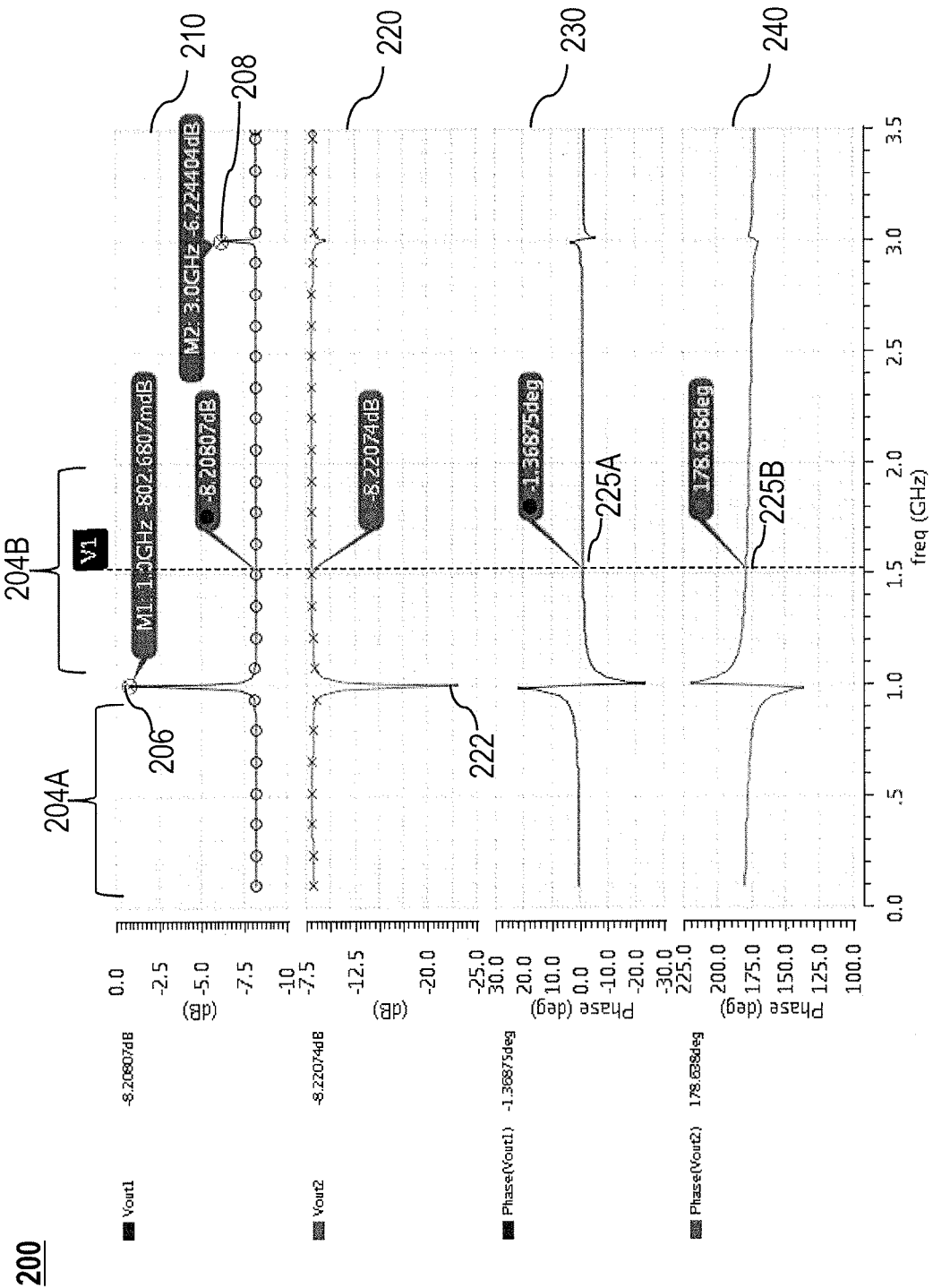
FIGS. 2 and 3 depict examples of plots showing magnitude and phase responses of the bandpass and notch filters of FIG. 1, in accordance with some example embodiments.

FIG. 2 depicts example plots 210, 220, 230, and 240 characterizing tunable RF filter 100, although other results may be realized as well.

Plot 210 depicts a periodic magnitude response of bandpass filter output 125 at a certain frequency, which in this example is a frequency band at about 1 Gigahertz (GHz) corresponding to a clock frequency driving filters 104 and 106. Plot 210 also shows that bandpass filter 104 allows a signal/band 206 of interest to pass, but stops/suppresses 204A-B other frequencies by approximately 8 dB. Plot 210 also shows about a 6 dB suppression of a third harmonic 208 of the signal/band 206.

Plot 220 is the frequency magnitude response of the notch filter output 127. The notch 222 suppresses/stops a certain frequency, which in this example is at 1 GHz.

Plot 230 represents the phase response of the bandpass filter output 125, and plot 240 shows the phase response of the notch filter output 127. The phase responses of bandpass filter 104 and notch filter 106 are 180 degrees out of phase 225A-B, which in this example is at a frequency of 1.52 GHz (which is the pass band of the notch filter) close to the 1 GHz frequency. In some example embodiments, the transistor switch resistance of the N path filters at band pass filter 104 and notch filter 106 may be configured such that the switch sizes may be the same or similar. This switch size represents a resistance (R), which may be varied to adjust the suppression/rejection provided by filters 104 and 106.

Figure 3:
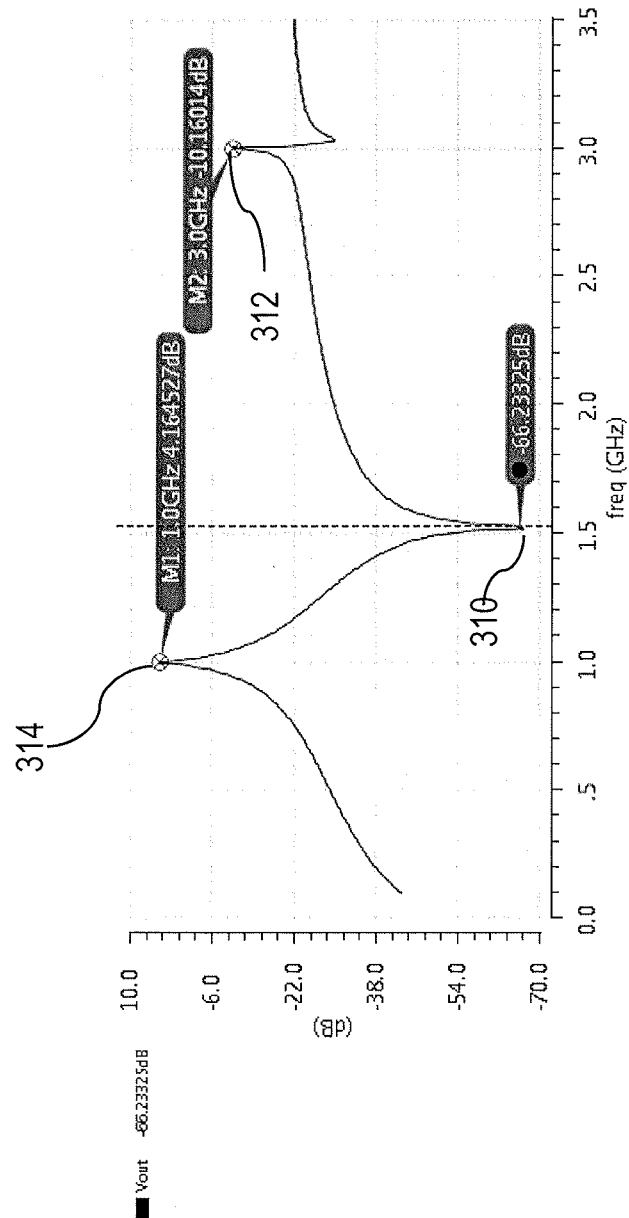

FIG. 3 depicts an example of a plot 300 of the periodic magnitude response of output 130 (FIG. 1), in accordance with some example embodiments. Referring to FIG. 3, a notch 310 is shown at a frequency of 1.52 GHz, and this notch is about 67 dB down from the signal level in the pass band at 1 GHz. In the example of FIG. 3, the output of the notch filter 106 is flipped (for example, with a phase change of 180 degrees or inverted) before being applied to the combiner 108. This flipping may make the magnitude and phase response identical for the bandpass and notch filters at 1.52 GHz, so cancellation can occur. Due to the small magnitude of the notch filter at 1 GHz, the insertion loss of the combined filter may not represent a substantial reduction (for example, about 0.5 dB less). In the example of FIG. 3, the third harmonic signal of the 1 GHz pass band signal 312 appears at 3 GHz 312, which has been further suppressed when compared to the bandpass filter output at 208 (FIG. 2).

Figure 4:
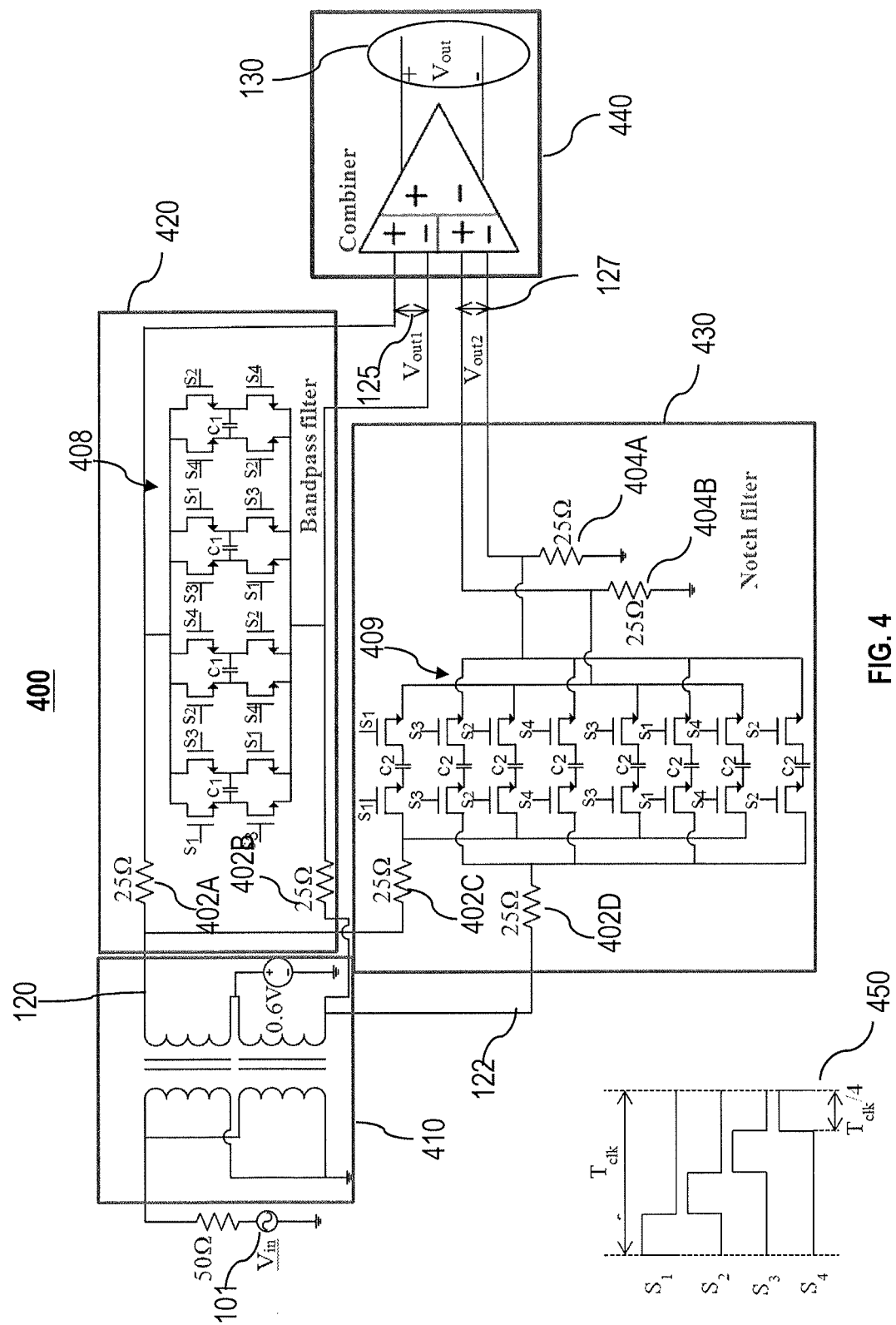
FIG. 4 depicts a block diagram of a filter, in accordance with some example embodiments.

FIG. 4 depicts an example of an RF filter 400, in accordance with some example embodiments.

The tunable RF filter 400 is similar to tunable RF filter 100 in some respects, but tunable RF filter 400 depicts an example implementation of a splitter 410, a bandpass filter 420, a notch filter 430, a combiner 440, and a four phase tuning clock 450.

In some example embodiments, signal divider 410 may use a balun device to generate differential signals 120 and 122 from a single-ended RF input signal 101.

The band pass filter 420 may receive differential signals 120 and 122 from the signal splitter 410. The band pass filter 420 may, in some example embodiments, be implemented as an N-path bandpass filter, and, in particular, tunable N-path filters 408. In the example of FIG. 4, the tunable N-path band pass filter 408 may include four paths (for example, N equals 4), and the N-path may comprise switches (for example, transistor switches, S1-S4) and capacitors (C1-C4) in a differential configuration. Band pass filter 420 may also include resistors 402A-B. The N-path band pass filter 420 may be configured in an R-C (resistive-capacitive) configuration of N-path filters 408; the N-path filters may act as a passive mixer. This R-C configuration may exhibit a low-pass characteristic about DC (direct current), which results in a bandpass when mixed around the clock frequency.

The notch filter 430 may receive differential signals 120 and 122 from splitter 410. Notch filter 430 may, in some example embodiments, be implemented as an N-path notch filter, and, in particular, tunable N-path filters 409. In the example of FIG. 4, the tunable N-path filters 409 may include four paths in a differential configuration as shown by the switches (for example, transistor switches, S1-S4) and capacitors (C1-C4). Moreover, the N-path filters 409 may be configured in a capactive-resistance (C-R) configuration. This C-R configuration may exhibit a high-pass characteristic around DC, which results in a notch around the clock frequency.

Notch filter 430 may include resistors 402C-D. Resistors 402A-D may provide isolation between the signals in bandpass filter 420 and notch filter 430, as well as provide input impedance matching for signal frequencies around the clock frequency. Notch filter 430 may also include load resistors 404A-B.

In some example embodiments, the frequency response of tunable N-path band pass filter 420 and the tunable N-path notch filter 430 may be tuned using four phase tuning clocks 450 by changing the clock frequency of the four phase tuning clocks.

In addition to tuning the RF filter 400 by varying clock frequency (for example, varying the frequency of clock 450), adjusting capacitor values of bandpass filter 420 and/or of notch filter 430 may also tune parameters of the RF filter 400. For example, changing the capacitor values of bandpass filter 420 may vary the bandwidth of the bandpass filter 420. Similarly changing the capacitor values of notch filter 430 may vary the bandwidth of the notch filter 430. Moreover, the frequency at which the notch is created may be moved to a frequency where an interference signal needs to be suppressed by adjusting the capacitor values of both the bandpass filter 420 and notch filter 430.

The bandpass filter output signal 125 and the notch filter output signal 127 may both be differential signals, and may serve as inputs to combiner 440, which may be implemented as a differential difference amplifier. The combiner 440 may also provide buffering and generate differential combined output 130, although other types of signal outputs may be provided as well.

FIG. 5A depicts an example of a differential difference amplifier having common mode feedback, which may be used as combiner 108/440.

Figure 5B:
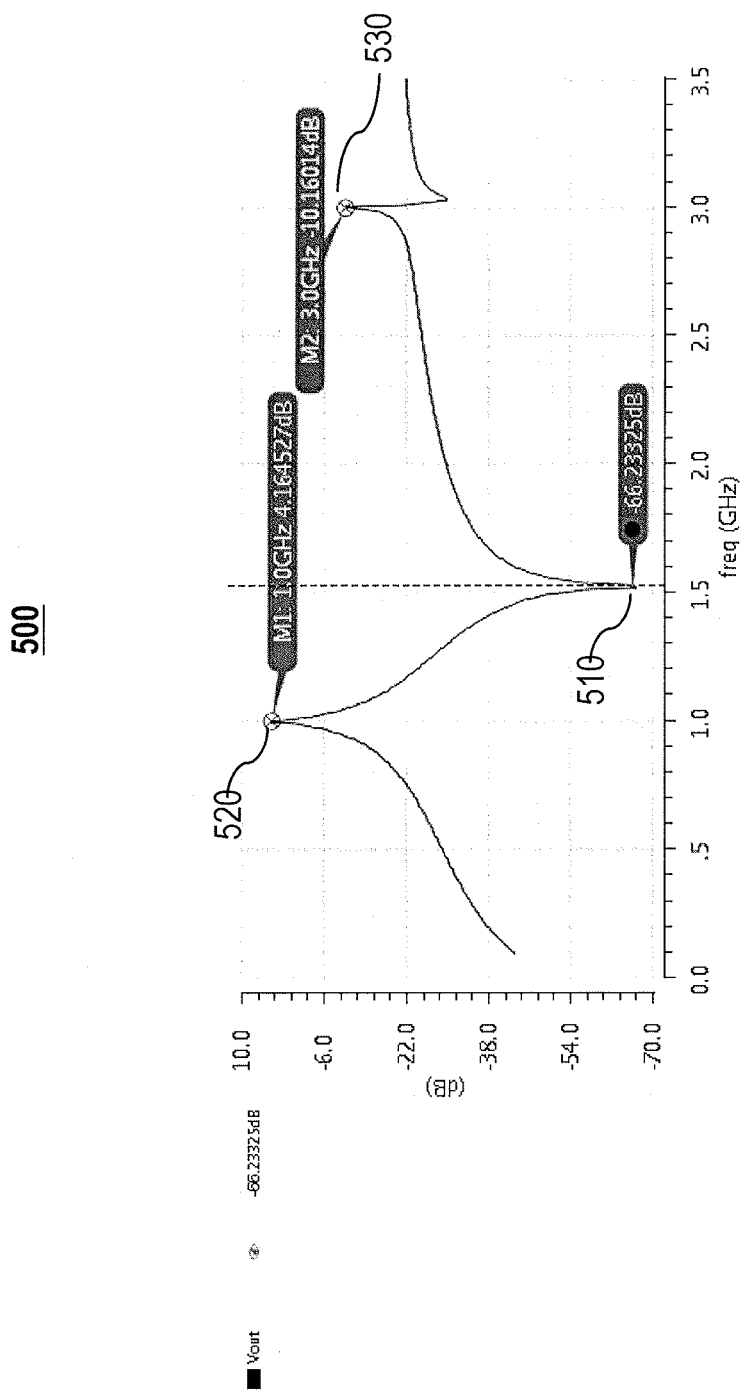
FIGS. 5B-D depict examples of plots showing the response of the radio frequency filter of FIG. 4, in accordance with some example embodiments.

FIG. 5B depicts an example periodic magnitude response plot 500, in accordance with some example embodiments. The plot 500 represents a magnitude response of the output signal 130 of tunable RF filter 400. It can be observed that the notch 510 at about 1.52 GHz in this example is about 67 dB down when compared to the signal level 520 in the pass band at 1 GHz. In this example, the third harmonic signal 530 at 3 GHz has also been further suppressed by about 14 dB, while in FIG. 3 at 312 the third harmonic at 3 GHz was only 5 dB down compared to pass band signal at 1 GHz. FIG. 5B also shows that the tunable RF filter 400 may achieve both high attenuation in the stop band and may also create a notch at an offset frequency.

Figure 5C:
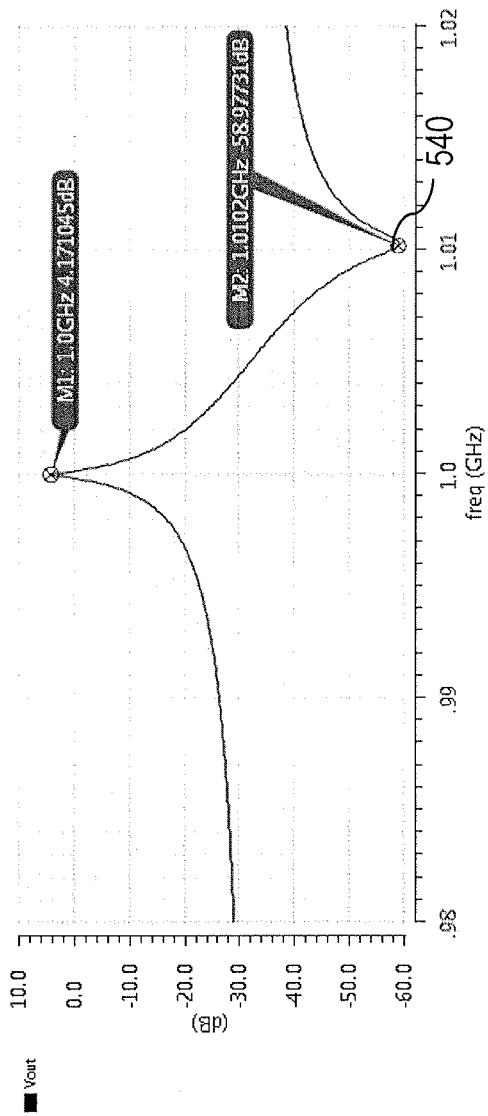

FIG. 5C depicts an example periodic magnitude response plot 599, in accordance with some example embodiments. By adjusting one or more capacitor values of the bandpass filter 420 and/or the notch filter 430, the frequency at which notch 540 is created can be moved to a frequency where an interfering signal (or blocker) need to be suppressed. As an example, the notch frequency 540 is shifted to a lower value (which in this example is 10 MHz) as shown in FIG. 5C. In this example, a relatively high value of capacitance is used at filters 420 and/or 430 to move the notch frequency from 510 (FIG. 5B) to the lower valued 540 as shown at FIG. 5C.

Figure 5D:
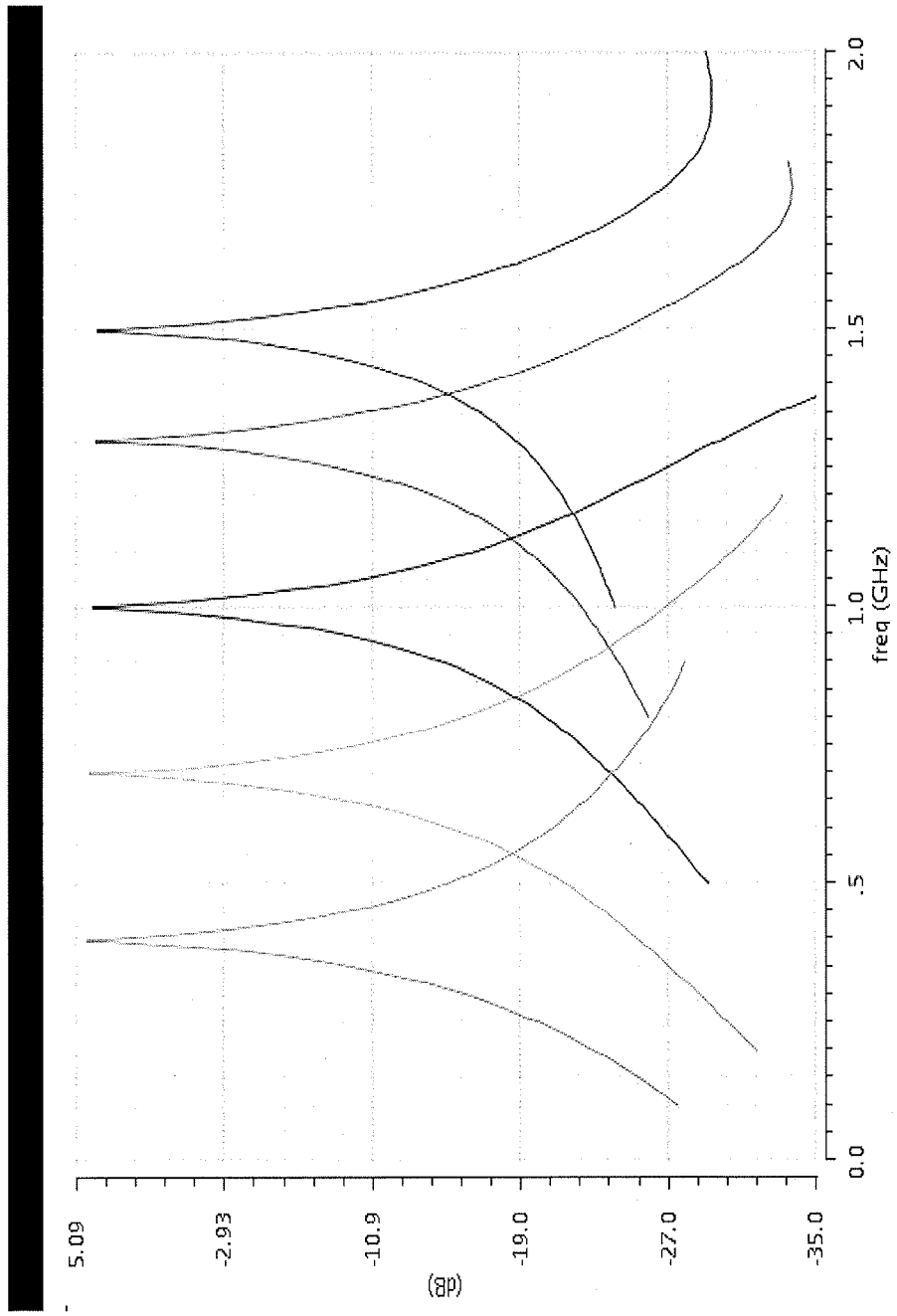

FIG. 5D depicts the tunablity aspects of the RF filter 400, in accordance with some example embodiments. The RF filter may be continuously tunable with the clock frequency over a wide band of frequencies. The tunability of the RF filter 400 is shown for some of the frequencies in the frequency band of 0.4 GHz to 1.5 GHz. To ensure clarity, the spectrum is shown from $f_{clk}$ −0.5 GHz to $f_{clk}$ +0.5 GHz for each clock frequency in the figure instead of the complete spectrum. The tuning can be performed by adjusting the clocks, such as clock 450.

In some example embodiments, tuning of RF filter 100 and/or 400 may be performed dynamically by for example a controller, such as a software application and the like, to control the tunable parameters including clock 450 and the like disclosed herein.

Figure 6:
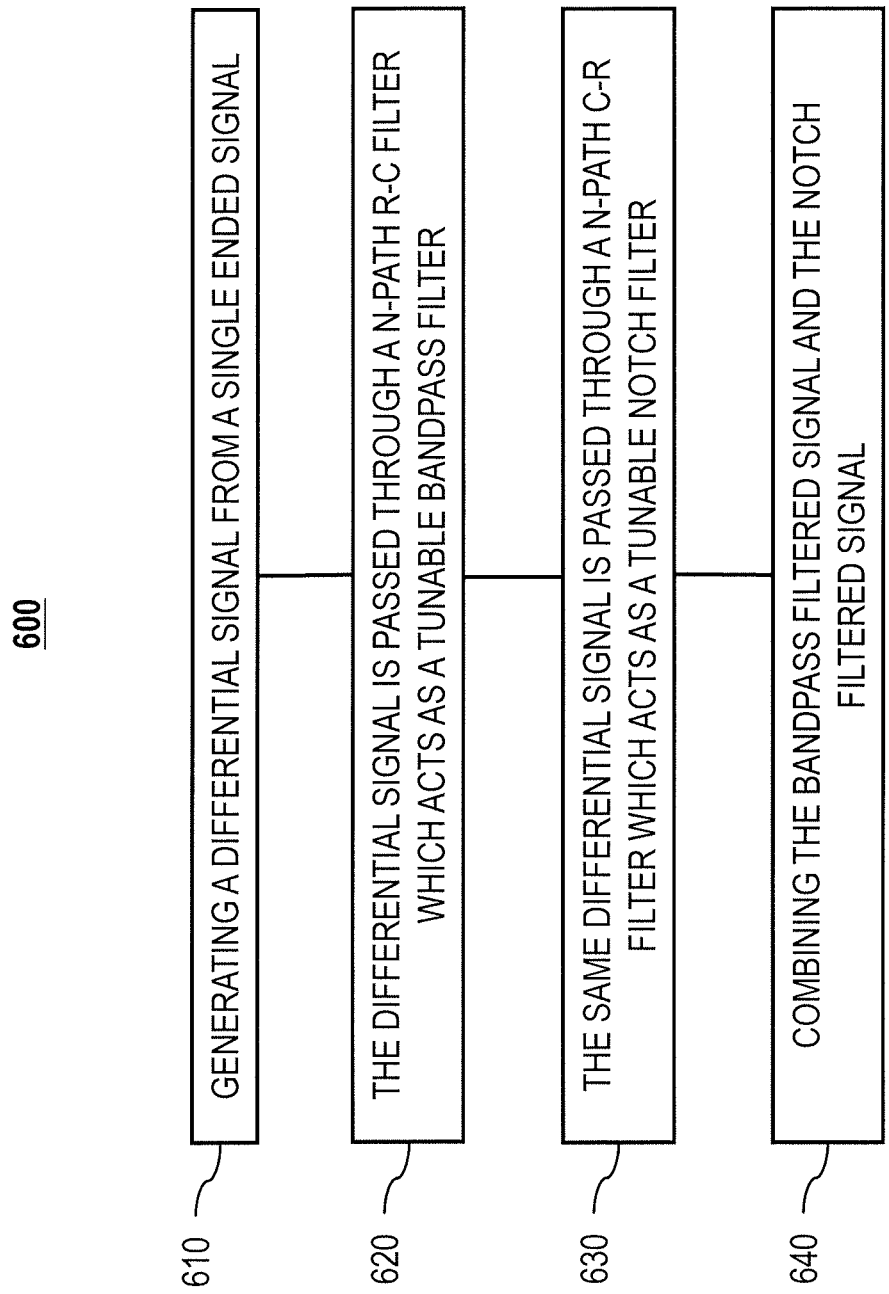
FIG. 6 depicts an example of a process for the radio frequency filter of FIGS. 1 and 4, in accordance with some example embodiments.

FIG. 6 depicts an example of a process 600 for filtering, in accordance with some example embodiments. The description of process 600 also refers to FIGS. 1, 4, and 5B-5C.

At 610, a differential signal may be generated from an input signal. For example, an input RF signal 101 may be received and split by a splitter 102, such as a balun, into differential signals 120 and 122. For example, the input RF signal 101 may represent a single-ended RF signal received at a radio transceiver, such as a radio transceiver of a user equipment, although other signals may be filtered as well.

At 620, a tunable bandpass filter 104 and/or 420 may receive the generated differential signals 120 and 122 and then filter the received signals to allow a pass band portion of the radio frequency spectrum to pass to bandpass output 125.

At 630, a tunable notch filter 106 and/or 430 may receive the generated signals 120 and 122 and then may filter the received signals by notching (or blocking) a portion of the spectrum. The notch filter may be driven by the same clock as the band pass filter. Standalone, the notch filter may have a notch response at the clock frequency as shown in FIG. 2. However, the notch created (after combining at 108/440) may be at an offset frequency which is determined by resistance and capacitance parameters of the band pass and notch filters. For example, the notch may be configured to provide, when combined at combiner 108/440, a substantial amount of suppression of a blocker, such as the radio's own transmitter as shown in FIG. 5B at 510 and the like.

At 640, combiner 108/440 may combine the outputs of tunable bandpass filter 104 and/or 420 and tunable notch filter 106 to form a combined output 130. Examples of the frequency response of combined output 130 using tunable N-path bandpass and notch filters are depicted at FIGS. 5B and 5C.

Figure 7:
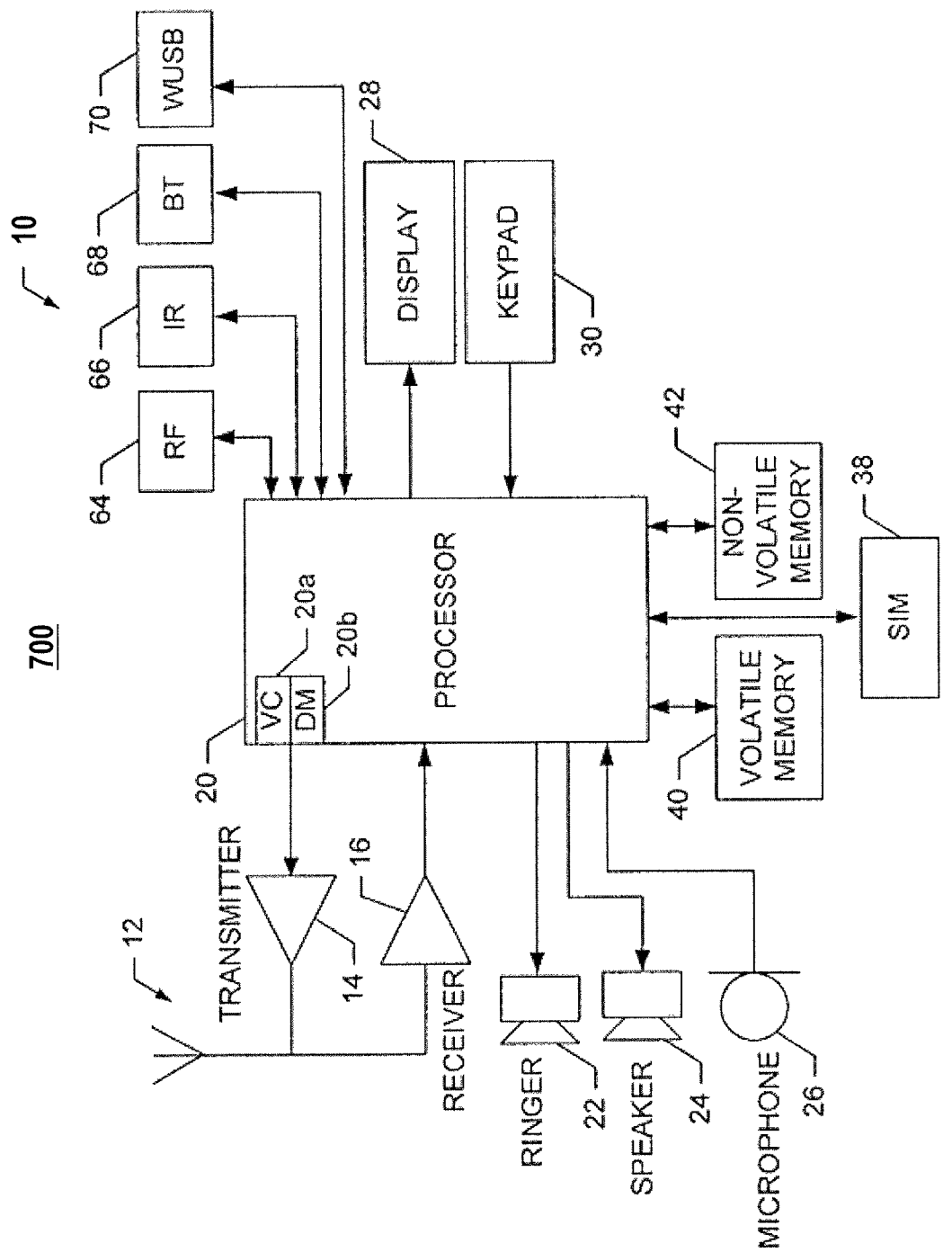
FIG. 7 depicts an example of an apparatus, in accordance with some example embodiments.

FIG. 7 illustrates a block diagram of an apparatus 10, which can be configured as a wireless device, in accordance with some example embodiments. For example, apparatus 10 may be implemented as a mobile device containing filter system 100. Apparatus 10 may be implemented as a smart phone, mobile station, a mobile unit, a subscriber station, a wireless terminal, a tablet, a wireless plug-in accessory, or any other device with a short-range transceiver, such as Bluetooth, Bluetooth Low Energy, and the like. In some example embodiments, one or more portions of the apparatus 10 may be incorporated into a media player, such as a television, wireless speaker, and the like.

The apparatus 10 may include at least one antenna 12 in communication with a transmitter 14 and a receiver 16. Alternatively transmit and receive antennas may be separate.

In some example embodiments, transmitter 14 and/or receiver 16 may include the tunable RF filter 100 and/or 400 in accordance with some example embodiments.

The apparatus 10 may also include a processor 20 configured to provide signals to, and receive signals from, the transmitter and receiver, respectively, and to control the functioning of the apparatus. Processor 20 may be configured to control the functioning of the transmitter and receiver by effecting control signaling via electrical leads to the transmitter and receiver. Likewise, processor 20 may be configured to control other elements of apparatus 10 by effecting control signaling via electrical leads connecting processor 20 to the other elements, such as a display or a memory. The processor 20 may, for example, be embodied in a variety of ways including circuitry, at least one processing core, one or more microprocessors with accompanying digital signal processor(s), one or more processor(s) without an accompanying digital signal processor, one or more coprocessors, one or more multi-core processors, one or more controllers, processing circuitry, one or more computers, various other processing elements including integrated circuits (for example, an application specific integrated circuit (ASIC), a field programmable gate array (FPGA), and/or the like), or some combination thereof. Accordingly, although illustrated in FIG. 7 as a single processor, in some example embodiments the processor 20 may comprise a plurality of processors or processing cores.

Signals sent and received by the processor 20 may include signaling information in accordance with an air interface standard of an applicable cellular system, and/or any number of different wireline or wireless networking techniques, comprising but not limited to Wi-Fi, wireless local access network (WLAN) techniques, such as Institute of Electrical and Electronics Engineers (IEEE) 802.11, 802.16, and/or the like. In addition, these signals may include speech data, user generated data, user requested data, and/or the like.

The apparatus 10 may be capable of operating with one or more air interface standards, communication protocols, modulation types, access types, and/or the like. For example, the apparatus 10 and/or a cellular modem therein may be capable of operating in accordance with various first generation (1G) communication protocols, second generation (2G or 2.5G) communication protocols, third-generation (3G) communication protocols, fourth-generation (4G) communication protocols, Internet Protocol Multimedia Subsystem (IMS) communication protocols (for example, session initiation protocol (SIP) and/or the like. For example, the apparatus 10 may be capable of operating in accordance with 2G wireless communication protocols IS-136, Time Division Multiple Access TDMA, Global System for Mobile communications, GSM, IS-95, Code Division Multiple Access, CDMA, and/or the like. In addition, for example, the apparatus 10 may be capable of operating in accordance with 2.5G wireless communication protocols General Packet Radio Service (GPRS), Enhanced Data GSM Environment (EDGE), and/or the like. Further, for example, the apparatus 10 may be capable of operating in accordance with 3G wireless communication protocols, such as Universal Mobile Telecommunications System (UMTS), Code Division Multiple Access 2000 (CDMA2000), Wideband Code Division Multiple Access (WCDMA), Time Division-Synchronous Code Division Multiple Access (TD-SCDMA), and/or the like. The apparatus 10 may be additionally capable of operating in accordance with 3.9G wireless communication protocols, such as Long Term Evolution (LTE), Evolved Universal Terrestrial Radio Access Network (E-UTRAN), and/or the like. Additionally, for example, the apparatus 10 may be capable of operating in accordance with 4G wireless communication protocols, such as LTE Advanced and/or the like as well as similar wireless communication protocols that may be subsequently developed.

It is understood that the processor 20 may include circuitry for implementing audio/video and logic functions of apparatus 10. For example, the processor 20 may comprise a digital signal processor device, a microprocessor device, an analog-to-digital converter, a digital-to-analog converter, and/or the like. Control and signal processing functions of the apparatus 10 may be allocated between these devices according to their respective capabilities. The processor 20 may additionally comprise an internal voice coder (VC) 20a, an internal data modem (DM) 20b, and/or the like. Further, the processor 20 may include functionality to operate one or more software programs, which may be stored in memory. In general, processor 20 and stored software instructions may be configured to cause apparatus 10 to perform actions. For example, processor 20 may be capable of operating a connectivity program, such as a web browser. The connectivity program may allow the apparatus 10 to transmit and receive web content, such as location-based content, according to a protocol, such as wireless application protocol, WAP, hypertext transfer protocol, HTTP, and/or the like.

Apparatus 10 may also comprise a user interface including, for example, an earphone or speaker 24, a ringer 22, a microphone 26, a display 28, a user input interface, and/or the like, which may be operationally coupled to the processor 20. The display 28 may, as noted above, include a touch sensitive display, where a user may touch and/or gesture to make selections, enter values, and/or the like. The processor 20 may also include user interface circuitry configured to control at least some functions of one or more elements of the user interface, such as the speaker 24, the ringer 22, the microphone 26, the display 28, and/or the like. The processor 20 and/or user interface circuitry comprising the processor 20 may be configured to control one or more functions of one or more elements of the user interface through computer program instructions, for example, software and/or firmware, stored on a memory accessible to the processor 20, for example, volatile memory 40, non-volatile memory 42, and/or the like. The apparatus 10 may include a battery for powering various circuits related to the mobile terminal, for example, a circuit to provide mechanical vibration as a detectable output. The user input interface may comprise devices allowing the apparatus 20 to receive data, such as a keypad 30 (which can be a virtual keyboard presented on display 28 or an externally coupled keyboard) and/or other input devices.

As shown in FIG. 7, apparatus 10 may also include one or more mechanisms for sharing and/or obtaining data. For example, the apparatus 10 may include a short-range radio frequency (RF) transceiver and/or interrogator 64, so data may be shared with and/or obtained from electronic devices in accordance with RF techniques. The apparatus 10 may include other short-range transceivers, such as an infrared (IR) transceiver 66, a Bluetooth (BT) transceiver 68 operating using Bluetooth wireless technology, a wireless universal serial bus (USB) transceiver 70, a Bluetooth Low Energy link, ZigBee link, a cellular device-to-device link, a wireless local area link, a Wi-Fi link, and/or any other short-range radio technology. In this regard, the apparatus 10 and, in particular, the short-range transceiver may be capable of transmitting data to and/or receiving data from electronic devices within the proximity of the apparatus, such as within 10 meters, for example. The apparatus 10 including the WiFi or wireless local area networking modem may also be capable of transmitting and/or receiving data from electronic devices according to various wireless networking techniques, including 6LoWpan, Wi-Fi, Wi-Fi low power, WLAN techniques such as IEEE 802.11 techniques, IEEE 802.15 techniques, IEEE 802.16 techniques, and/or the like.

The apparatus 10 may comprise memory, such as a subscriber identity module (SIM) 38, a removable user identity module (R-UIM), an eUICC, an UICC, and/or the like, which may store information elements related to a mobile subscriber. In addition to the SIM, the apparatus 10 may include other removable and/or fixed memory. The apparatus 10 may include volatile memory 40 and/or non-volatile memory 42. For example, volatile memory 40 may include Random Access Memory (RAM) including dynamic and/or static RAM, on-chip or off-chip cache memory, and/or the like. Non-volatile memory 42, which may be embedded and/or removable, may include, for example, read-only memory, flash memory, magnetic storage devices, for example, hard disks, floppy disk drives, magnetic tape, optical disc drives and/or media, non-volatile random access memory (NVRAM), and/or the like. Like volatile memory 40, non-volatile memory 42 may include a cache area for temporary storage of data. At least part of the volatile and/or non-volatile memory may be embedded in processor 20. The memories may store one or more software programs, instructions, pieces of information, data, and/or the like which may be used by the apparatus for performing functions of the user equipment/mobile terminal. The memories may comprise an identifier, such as an international mobile equipment identification (IMEI) code, capable of uniquely identifying apparatus 10. The functions may include one or more of the operations disclosed herein with respect to the user equipment including tunable RF filters, such as the functions disclosed at process 600 and any other operations disclosed with respect tunable RF filter 100 and 400 disclosed herein (including the control of the tuning of the tunable RF filters). For example, the user equipment including the tunable RF filter 100 and/or 400 may split an input signal into differential signals, bandpass filter, notch filter, and combine the bandpass and notch filter outputs to form a combined output. The memories may comprise an identifier, such as an international mobile equipment identification (IMEI) code, capable of uniquely identifying apparatus 10. In some example embodiments, the processor 20 may be configured using computer code stored at memory 40 and/or 42 to enable operations disclosed with respect to the user equipment.

Figure 8:
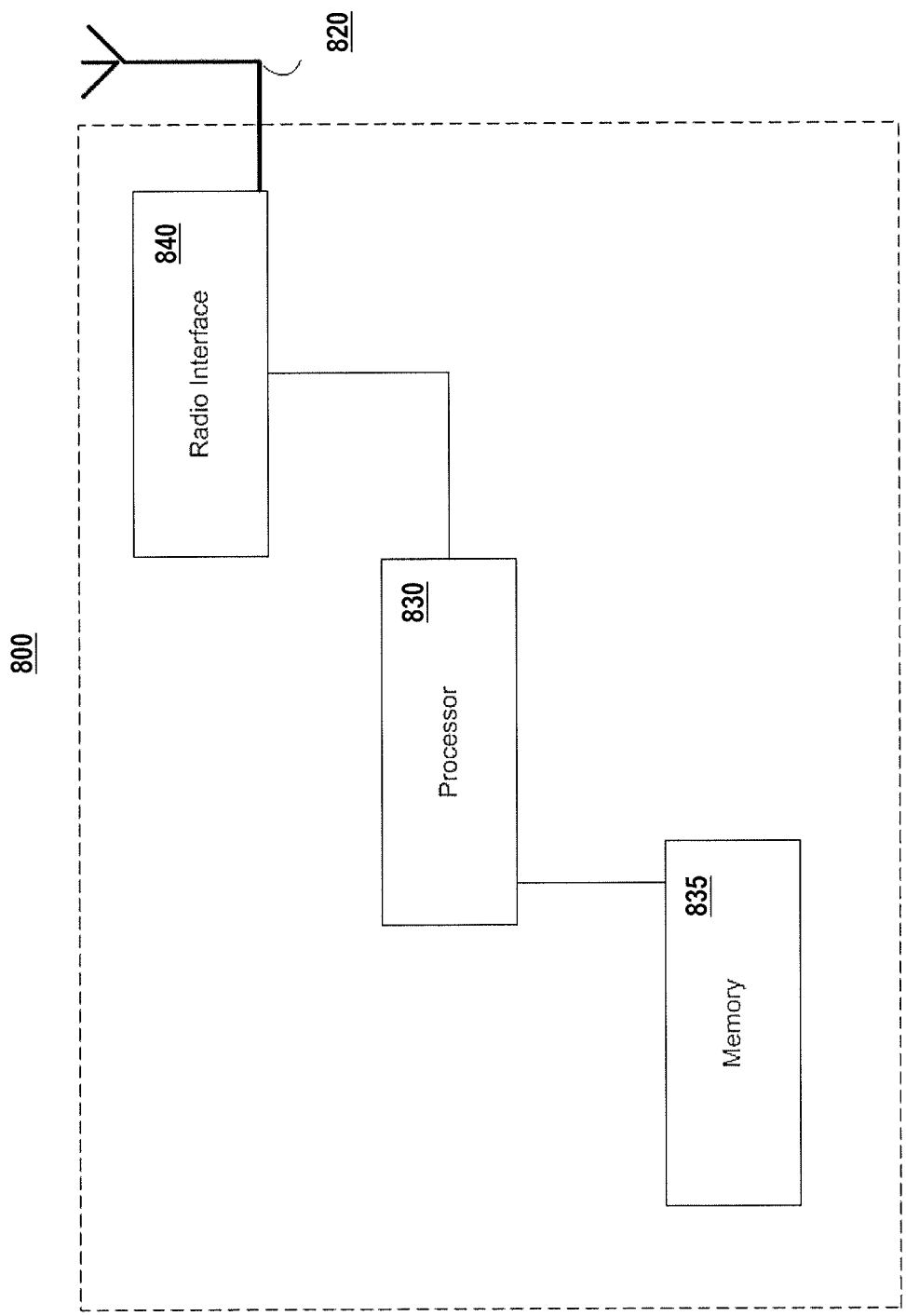
FIG. 8 depicts an example of a network node, in accordance with some example embodiments.

FIG. 8 depicts an example implementation of a network node 800, such as for example a base station, and the like. The network node 800 may include one or more antennas 820 configured to transmit via a downlink and configured to receive uplinks via the antenna(s) 820. The network node 800 may further include a plurality of radio interfaces 840 coupled to the antenna 820. The radio interfaces may correspond one or more of the following: Long Term Evolution (LTE, or E-UTRAN), Third Generation (3G, UTRAN, or high speed packet access (HSPA)), Global System for Mobile communications (GSM), wireless local area network (WLAN) technology, such as for example 802.11 WiFi and/or the like, Bluetooth, Bluetooth low energy (BT-LE), near field communications (NFC), and any other radio technologies. The radio interface 840 may further include other components, such as for example filters, converters (for example, digital-to-analog converters and the like), mappers, a Fast Fourier Transform (FFT) module, and the like, to generate symbols for a transmission via one or more downlinks and to receive symbols (for example, via an uplink).

In some example embodiments, the radio interface 840 may include a radio having the tunable RF filter 100 and/or 400 disclosed herein.

The network node 800 may further include one or more processors, such as for example processor 830, for controlling the network node 800 and for accessing and executing program code stored in memory 835. In some example embodiments, memory 835 includes code, which when executed by at least one processor causes one or more of the operations described herein with respect to network node, such as for example a base station, access point, and the like. For example, network node 800 including tunable RF filter 100 and/or 400 may perform the processes disclosed herein with respect to tunable RF filter 100 and/or 400 (see, for example, process 600 and the like).

Some of the embodiments disclosed herein may be implemented in software, hardware, application logic, or a combination of software, hardware, and application logic. The software, application logic, and/or hardware may reside on memory 40, the control apparatus 20, or electronic components, for example. In some example embodiment, the application logic, software or an instruction set is maintained on any one of various conventional computer-readable media. In the context of this document, a "computer-readable medium" may be any non-transitory media that can contain, store, communicate, propagate or transport the instructions for use by or in connection with an instruction execution system, apparatus, or device, such as a computer or data processor circuitry, with examples depicted at FIGS. 7 and 8. A computer-readable medium may comprise a non-transitory computer-readable storage medium that may be any media that can contain or store the instructions for use by or in connection with an instruction execution system, apparatus, or device, such as a computer. In addition, some of the embodiments disclosed herein include computer programs configured to cause methods as disclosed herein.

Without in any way limiting the scope, interpretation, or application of the claims appearing below, a technical effect of one or more of the example embodiments disclosed herein is a tracking filter that can be used in cellular systems. Without in any way limiting the scope, interpretation, or application of the claims appearing below, another technical effect of one or more of the example embodiments disclosed herein is a lower power consumption of the filter 100 and/or 400 due to the passive framework of the filters 100 and/400, when compared to more active filter frameworks.

Although some of the examples described herein refer to filters 100 and 400 being used in a receiver, the filters 150 and 400 may be used in other applications including low frequency applications as well. For example, the filters 100 and 400 may be used in a transmitter front-end as well. In the case of a transmitter, the notch may be placed at a frequency where a maximum noise suppression is desired (which is usually in a receive-band).

Although some of the examples disclosed herein provide specific values and simulated results such a magnitude and frequency responses, these values and results serve only as examples as other values and results may be realized as well.

If desired, the different functions discussed herein may be performed in a different order and/or concurrently with each other. Furthermore, if desired, one or more of the above-described functions may be optional or may be combined. Although various aspects of the invention are set out in the independent claims, other aspects of the invention comprise other combinations of features from the described embodiments and/or the dependent claims with the features of the independent claims, and not solely the combinations explicitly set out in the claims. It is also noted herein that while the above describes example embodiments, these descriptions should not be viewed in a limiting sense. Rather, there are several variations and modifications that may be made without departing from the scope of the present invention as defined in the appended claims. Other embodiments may be within the scope of the following claims. The term "based on" includes "based on at least."

What is claimed:

1. An apparatus comprising:
   a bandpass filter comprising a resistive-capacitive configuration of N-path filters tunable to a first center frequency based on at least a first clock frequency;
   a notch filter comprising a capacitive-resistive configuration of N-path filters tunable to a second center frequency based on at least a second clock frequency;
   a combiner coupled to the bandpass filter and the notch filter to combine a bandpass output signal provided by the bandpass filter and a notch output signal provided by the notch filter, wherein the combiner outputs a combined output; and
   a splitter coupled to the bandpass filter and the notch filter, wherein the splitter provides a differential signal to an input of the notch filter and the bandpass filter.

2. The apparatus of claim 1, wherein the splitter comprises a balun.

3. The apparatus of claim 1, wherein the combiner comprises a differential difference amplifier.

4. The apparatus of claim 1 further comprising:
   a clock to tune at least one of the first center frequency and the second center frequency by at least varying a frequency of at least one of the first clock and the second clock.

5. The apparatus of claim 1, wherein the first clock frequency and the second clock frequency are the same frequency.

6. The apparatus of claim 1, wherein the resistive-capacitive configuration of N-path filters comprises one or more transistors coupled to one or more capacitors.

7. The apparatus of claim 1, wherein the first center frequency comprises a center of a pass band of the bandpass filter.

8. The apparatus of claim 1, wherein the second center frequency comprises a center of a notch band of the notch filter.

9. The apparatus of claim 1, wherein the combined output includes a notch frequency at a frequency offset from the second clock frequency.

10. A method comprising:
    receiving, at a bandpass filter, a differential signal, wherein the bandpass filter comprises a resistive-capacitive configuration of N-path filters tunable to a first center frequency based on at least a first clock frequency;
    receiving, at a notch filter, the differential signal, wherein the notch filter comprises a capacitive-resistive configuration of N-path filters tunable to a second center frequency based on at least a second clock frequency;
    combining, by a combiner coupled to the bandpass filter and the notch filter, a bandpass output signal provided by the bandpass filter and a notch output signal provided by the notch filter, wherein the combiner outputs a combined output; and
    splitting, by a balun, a radio frequency signal to generate the differential signal.

11. The method of claim 10, wherein the combiner comprises a differential difference amplifer.

12. The method of claim 10, wherein the first clock frequency and the second clock frequency are the same frequency.

13. The method of claim 10 further comprising:
    varying a first clock frequency and a second clock frequency to vary at least one of the first center frequency and the second center frequency.

14. An apparatus comprising:
    means for receiving, at a bandpass filter, a differential signal, wherein the bandpass filter comprises a resistive-capacitive configuration of N-path filters tunable to a first center frequency based on at least a first clock frequency;
    means for receiving, at a notch filter, the differential signal, wherein the notch filter comprises a capacitive-resistive configuration of N-path filters tunable to a second center frequency based on at least a second clock frequency;
    means for combining, by a combiner coupled to the bandpass filter and the notch filter, a bandpass output signal provided by the bandpass filter and a notch output signal provided by the notch filter, wherein the combiner outputs a combined output; and means for splitting a radio frequency signal to generate the differential signal.

15. A non-transitory computer-readable storage medium including computer program code, which when executed by at least one processor circuitry causes operations comprising:
   receiving a radio frequency signal;
   filtering, by an N-path bandpass filter tunable to a first center frequency having a pass band, a received radio frequency signal into a first output signal;
   suppressing, by an N-path notch filter tunable to a second center frequency, the received radio frequency signal into a second output signal;
   combining, by a combiner coupled to the N-path bandpass filter and the N-path notch filter, the first output signal provided by the N-path bandpass filter and the second output signal provided by the N-path notch filter; and
   splitting, by a balun, a radio frequency signal to generate the differential signal.

* * * * *